US007795963B2

(12) United States Patent
Letemplier

(10) Patent No.: US 7,795,963 B2
(45) Date of Patent: Sep. 14, 2010

(54) TWO-PEAK-POWER-LEVEL CONTROL METHOD AND DEVICE FOR A PULSE-MODE AMPLIFIER

(75) Inventor: Alain Letemplier, Mayenne (FR)

(73) Assignee: Thales (FR)

( * ) Notice: Subject to any disclaimer, the term of this patent is extended or adjusted under 35 U.S.C. 154(b) by 75 days.

(21) Appl. No.: 12/065,381

(22) Filed: Sep. 12, 2008

(65) Prior Publication Data

US 2009/0128234 A1 May 21, 2009

(30) Foreign Application Priority Data

Aug. 30, 2005 (FR) .................................. 05 08877

(51) Int. Cl.
*H03F 3/38* (2006.01)
(52) U.S. Cl. ........................................................ 330/10
(58) Field of Classification Search ................... 330/10; 348/707
See application file for complete search history.

(56) References Cited

U.S. PATENT DOCUMENTS 4,237,555 A 12/1980 Dishal 5,832,373 A 11/1998 Nakanishi et al.
6,188,276 B1 * 2/2001 Simopoulos .................. 330/10
6,584,303 B1 6/2003 Kingswood et al.

OTHER PUBLICATIONS

Lepine, F. et al. "A high efficient LDMOS power amplifier based on an inverse class F. architecture.", Microwave Conference, 2004. 34th European Amsterdam, The Netherlands Oct. 13, 2004, Piscataway, NJ, USA, IEEE, Oct. 11, 2004, pp. 1181-1184, XP010788306. ISBN: 1-58053-992-0.

* cited by examiner

*Primary Examiner*—Steven J Mottola
(74) *Attorney, Agent, or Firm*—Lowe Hauptman Ham & Berner, LLP

(57) ABSTRACT

A device for controlling least two peak power levels for an amplifier operating in pulse mode, comprising a premodulation stage and a power-locked stage. The premodulation stage has a first amplifier stage, having at least one amplifier (1) and one processing device (8) suitable for supplying a squarewave signal to the amplifier (1), and a second amplifier stage, having at least one amplifier (7) and one processing device (9) suitable for supplying a signal having a shape roughly identical to the shape of the applied modulation. The power-locked stage has a coupler and detector (11) for sampling at least a part of the signal at the output of the amplification subsystem and sending it to a video amplifier (22). A peak detector (24) and a level discriminator (25) are suitable for generating a modulation signal to an amplifier (20) and power supply means ($2_1$, $2_2$, $2_3$) are supplied for the amplifiers.

6 Claims, 4 Drawing Sheets

TWO-PEAK-POWER-LEVEL CONTROL METHOD AND DEVICE FOR A PULSE-MODE AMPLIFIER

CROSS-REFERENCE TO RELATED APPLICATIONS

The present Application is based on International Application No. PCT/EP2006/065838, filed on Aug. 30, 2006, which in turn corresponds to French Application No. 05 08877, filed on Aug. 30, 2005, and priority is hereby claimed under 35 USC §119 based on these applications. Each of these applications are hereby incorporated by reference in their entirety into the present application.

FIELD OF THE INVENTION

The invention relates notably to a control method and device of at least two power levels for an amplifier operating in pulse mode. The invention relates, for example, to a peak power control device for controlling a wideband pulse radiofrequency RF power transmitter that can deliver two peak power levels called normal power and reduced power.

BACKGROUND OF THE INVENTION

For the power pulse transmitters that have to deliver a reduced power of n dB by application of a discrete control signal, the use of the following methods is known:
- adding at the output of a transmitter, a power switch enabling or not enabling an n dB attenuator,
- adding between two low power stages, a switch enabling or not enabling either an n dB attenuator or an n dB amplifier stage,
- varying the DC power supply of n class C bipolar stages.

However, these devices present certain drawbacks:

The power switch notably introduces losses. The power amplifier must therefore be more powerful than is necessary for its operation. Thus, it must always operate at a maximum power. Furthermore, the layout has to allow the attenuator to be integrated.

The difficulty is to guarantee an identical gain of the following stages for each of the two power levels. This problem soon becomes insurmountable when it concerns a wideband amplifier.

The power variation range is limited to 2 dB per class C bipolar stage.

The invention relates to a device for controlling at least two peak power levels for an amplifier operating in pulse mode, characterized in that it comprises at least the following elements:

a premodulation stage comprising at least:
  a first amplifier stage, comprising at least one amplifier and a processing device suitable for supplying a squarewave signal to the amplifier,
  a second amplifier stage, comprising at least one amplifier and a processing device suitable for supplying a signal having a shape roughly identical to the shape of the applied modulation, A power-locked stage comprising at least:
  a coupler and detector for sampling at least a part of the signal at the output of the amplification subsystem and sending it to a video amplifier,
  a peak detector and a level discriminator suitable for generating a modulation signal to an amplifier,
  power supply means for the amplifiers.

The device and the method according to the invention offer notably the following advantages:
  the system makes it possible to ensure the integrity of the transmitted Gaussian pulse, accurately regulate its peak power levels throughout the frequency band concerned and obtain performance levels that are stable temperature-wise,
  reduced dimensions, weight and volume for the onboard applications,
  the system is fast enough to ensure sufficient agility of the power variation and the widest possible variation range without sacrificing accuracy.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

The device and the method according to the invention rely notably on the gain control of n stages of an amplification subsystem rather than on the use of devices allowing for an attenuation which is synonymous with pointless losses.

The invention consists notably, through a detection of the transmitted signal on the one hand and the use of a variable-gain RF amplifier on the other hand, in generating a Gaussian-form pulse signal of amplitude controlled by a digitized locking system having two or more peak power levels that can be selected by a discrete signal.

DETAILED DESCRIPTION OF THE DRAWINGS

Figure 1:
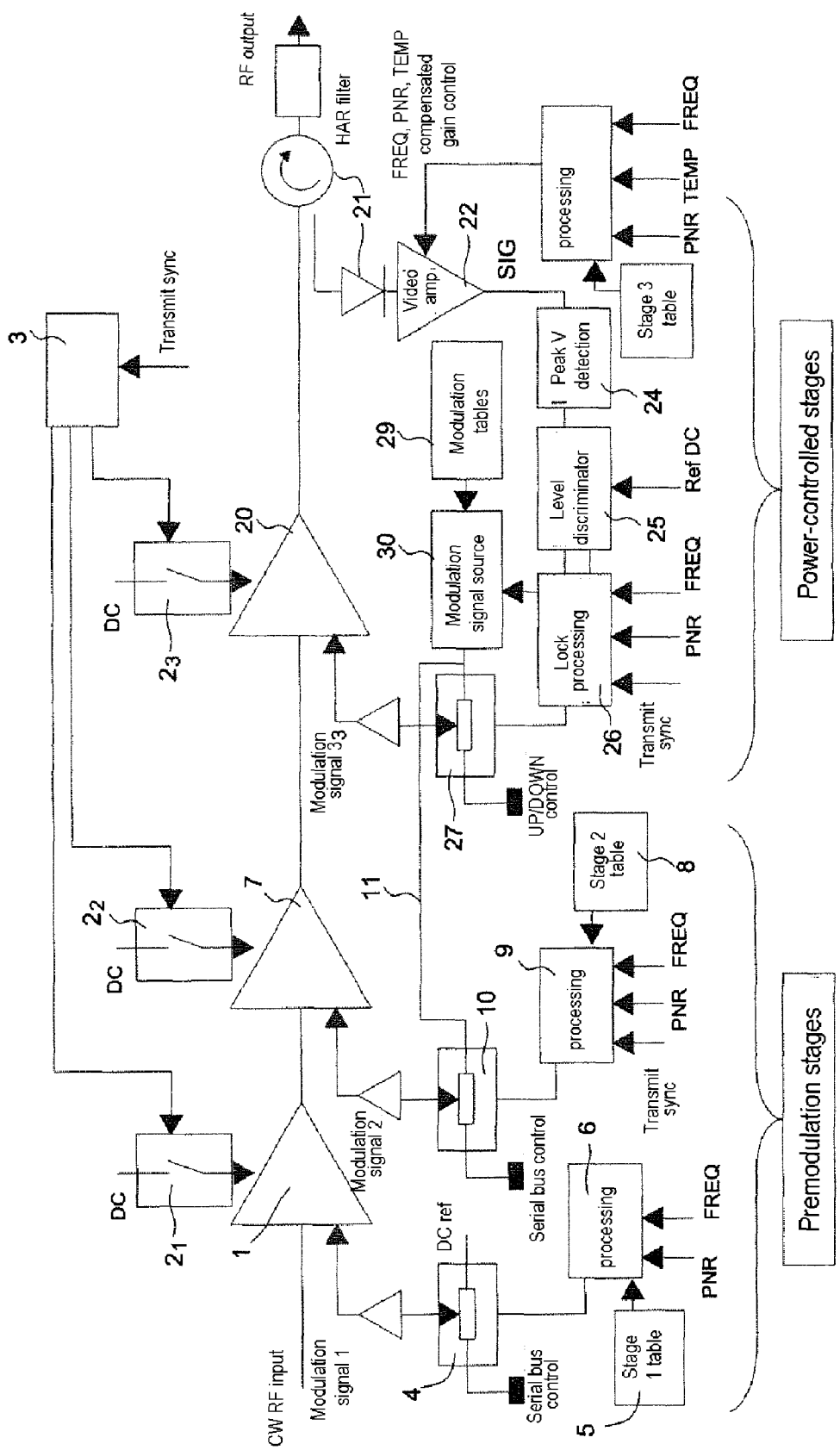
FIG. 1, the architecture of a device that can be used to control two peak power levels according to the invention, FIGS. 2A and 2B, different timing diagrams corresponding to the control signals and to the modulation signals, FIG. 3, an architecture for a pulsed voltage-controlled amplifier that can be used in the scheme according to the invention.

FIG. 1 diagrammatically represents an exemplary architecture for the inventive system. It comprises, for example, a power-slave stage and one or more premodulation stages. These stages are detailed hereinbelow.

First Amplification Stage

The first RF amplification stage uses, for example, an LDMOS transistor 1 used in class AB with pulse drain power supply. For this, the power supply $2_1$ is linked to a processing device 3 receiving a transmit synchronization signal and transmitting a control accordingly enabling a switched-mode power supply for the amplifier.

The gain of the first stage is controlled by a variable DC voltage 4 generated from two digital tables stored, for example, in SEPROM 5, intended to control a digital potentiometer 4 making it possible to adjust the amplitude of the modulation signal, the form of which is generated via a DC voltage source referenced DC in the figure. Each of the frequencies in reduced power and normal power modes corresponds to a DC voltage. The two tables are addressed, according to the frequency Freq to be transmitted and the "Normal power/Reduced power" control signal, by a processing device 6. The duly generated modulation signal is transmitted to the amplifier 1.

The result of this at the output of the variable gain RF amplifier 1, is two peak power levels with a spacing of half the power difference. Each of the two power levels is fixed according to the frequency. It can, if necessary, incorporate a pre-emphasis if necessary.

At the output of the amplifier 1, squarewave RF pulses are obtained, the peak power of which takes two fixed values according to the frequency according to the state of the reduced power control discrete (PNR). The pulses are transmitted to a second power amplifier.

The difference between the maximum power and the reduced power is limited by the inverse gain of the stage. To retain a good accuracy and remain within a control voltage range, the smallest possible difference value is sought, given the bandwidth constraints. The maximum difference which can be reached is, for example, limited to 7 to 8 dB.

Second Amplification Stage

The second RF amplification stage uses, for example, an LDMOS transistor 7 used in class AB with pulse drain power supply $2_2$. The gain of the stage is controlled by a variable-amplitude modulated voltage.

This stage is used if the difference between the two power levels present at the input of the transistor exceeds 7 to 8 dB.

The modulation signal's maximum amplitude information is generated from n*2 digital tables stored in SEPROM 8 addressed according to the frequency to be transmitted and the Pnormal/Preduced discrete, n being addressed according to the result of measurement of the mid-amplitude width of the transmitted pulse, the signal produced is therefore also width-controlled. A processing device 9 receives the transmit synchronization signals, the PNR and the required frequency Freq to be transmitted.

The shape of the modulation signal is generated via a digital-analogue converter DAC (modulation source) 30 from n*2 digital tables selected by the Pnormal/Preduced control signal. It is synchronized by the transmit controls. The potentiometer 10 can be used to vary the amplitude of the modulation signal (modulation signal 2).

This modulation signal is the same or roughly the same as that used by the power-locked stage. The modulation over two successive stages makes it possible notably to retain the integrity of the pulses to be transmitted in the region of their foot. The use of n*2 different tables according to the power level is associated with the non-linearity of the gain curves of the LDMOS amplifier stages.

The result of this, at the output of the second amplification stage (at the output of the amplifier 7), is two output peak power levels spaced by all the necessary power difference. Each of the two power levels is fixed according to the frequency. It can, if necessary, incorporate a pre-emphasis.

At the output of the second amplification stage, RF pulses are therefore obtained of a shape corresponding to the applied modulation (modulation by transistor gate polarization) and the peak power of which can take two fixed values according to the frequency according to the state of the reduced power control discrete (PNR). The width is controlled by controlling the modulation signal.

Power-Controlled Stage

The power stage comprises in particular:
  a variable-gain RF amplifier 20,
  a coupler and a detector which are referenced 21, and stabilized particularly in temperature.
  The detected signal $$k \times \sqrt{P_{peak}}$$

is applied to video amplifier 22, the gain of which is controlled by a digital potentiometer with serial control bus to provide the frequency and temperature compensation for the RF amplifier. Furthermore, the video amplifier 22 has two gain setting ranges according to the reduced power control (PNR).

A peak detector 24 and a level discriminator 25 send, from a setpoint value "Ref DEC", the peak power information to a processing-controlling device 26 which generates a synchronized control for incrementing or decrementing a digital potentiometer 27 with UP/DOWN interface, so generating the modulation signal of the RF stage from the modulation signal generated via a DAC converter 28 from two digital tables selected by the Pnormal/Preduced discrete (identical to that used by the preceding stage).

The output peak power is thus servo-controlled, pulse-by-pulse, onto a value such that the signal detected as video amplifier output 22 is equal or roughly equal to this setpoint value. The RF output power depends in particular on the gain of the video amplifier, which is controlled by its gain control derived from a frequency, temperature and PNR ndexed digitized table 29.

$$P_{peak} = \left(\frac{setpoint}{A \times K}\right)^2$$

with
  K: which varies according to the frequency and temperature sensitivity of the detection system and, where appropriate, of the elements (circulator, HAR filter, etc.) outside the servo-controllet loop inserted between the output power sampling coupler (21) and the RF output of the video amplifier.
  A: the gain of the video amplifier is controlled by the system and generated from a frequency, temperature and PNR indexed digitized table. It compensates the effect of K. For the Ppeak to be constant, the product AK must be constant.
  The setpoint value: produced using a voltage reference.
  The level discriminator will generate two indications P too high and P too low, from two MAX and MIN threshold values (fraction of the reference voltage). The voltage difference between MAX and MIN will create the hysteresis needed to obtain locking convergence and so determine the locking accuracy.
  The premodulation stage with power-to-noise ratio PNR control can be used to obtain signals modulating the very adjacent servo-controlled stage, whether P normal or P reduced applies, because the gain of the controlled RF stage remains almost constant. This makes it possible to obtain a minimal transition time from normal power to reduced power and vice versa bearing in mind that the latter depends on the number of pulses to be transmitted and the value of a modulation level control potentiometer correction step.

Figure 2A:
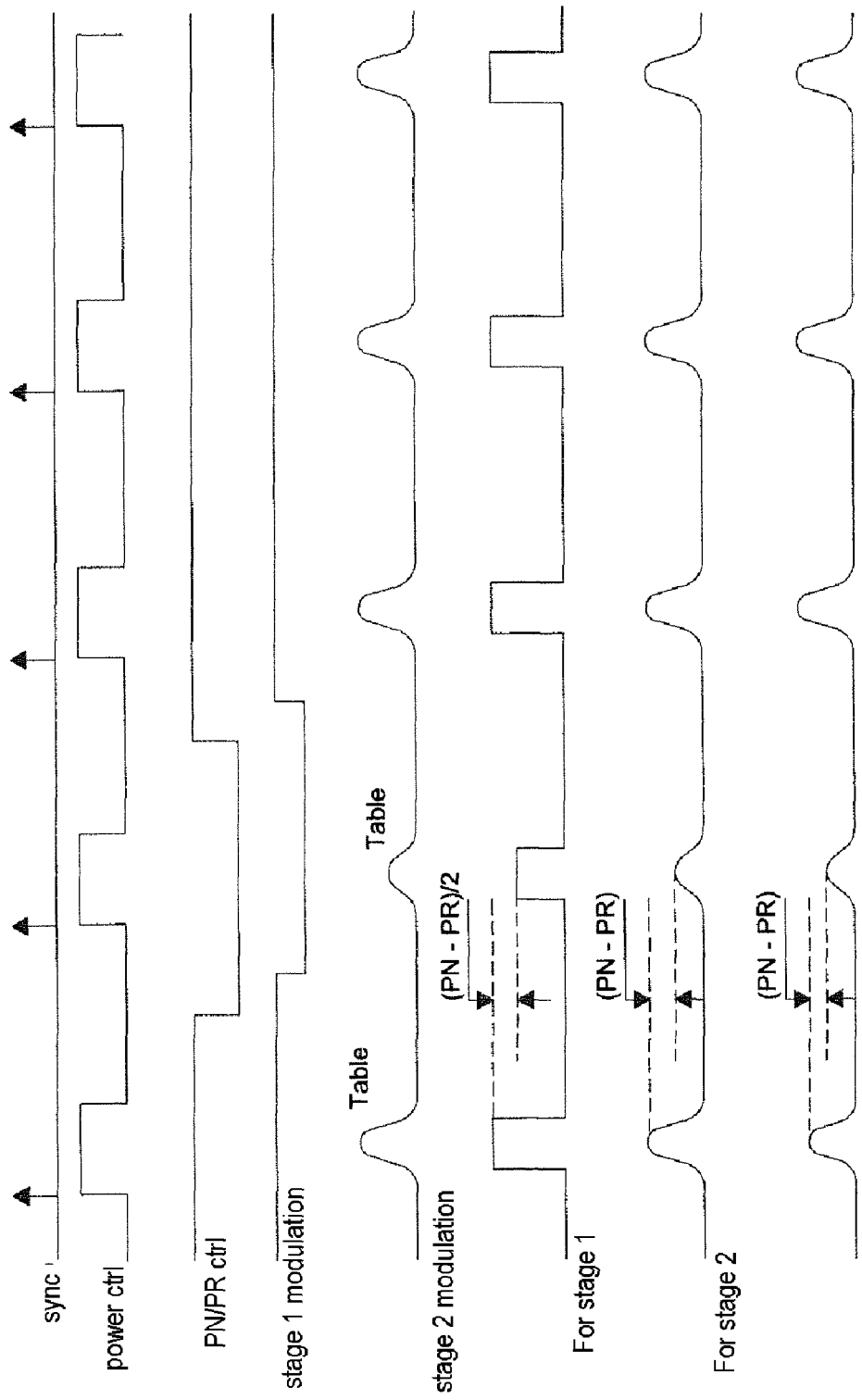
Figure 2B:
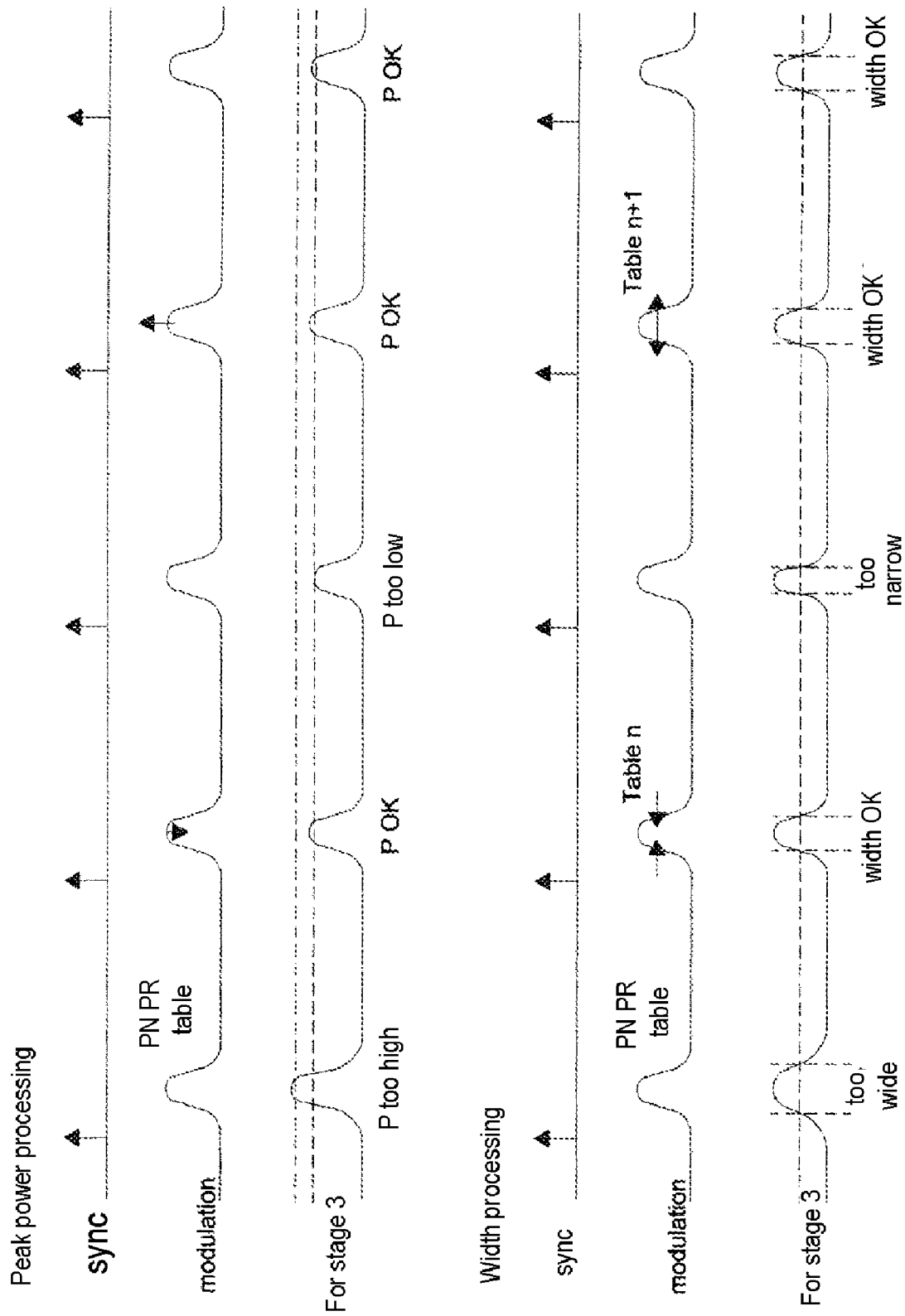

FIGS. 2A and 2B represent the timing diagrams of the control and modulation signals at various points of the amplification subsystem.

Starting from the top, the following are represented on the time axis:

For PN/PR Processing Operations the synchronization signal, the power control for the various transistors of the subsystem, the PN/PR control, the first stage modulation signal, the second stage modulation signal, the power obtained at the output of the first stage, the power obtained at the output of the second stage, For Peak Power Processing the synchronization signal, the modulation signal, the output power of stage 3, For Width Processing the synchronization signal, the modulation signal, the output power of stage 3.

Figure 3:
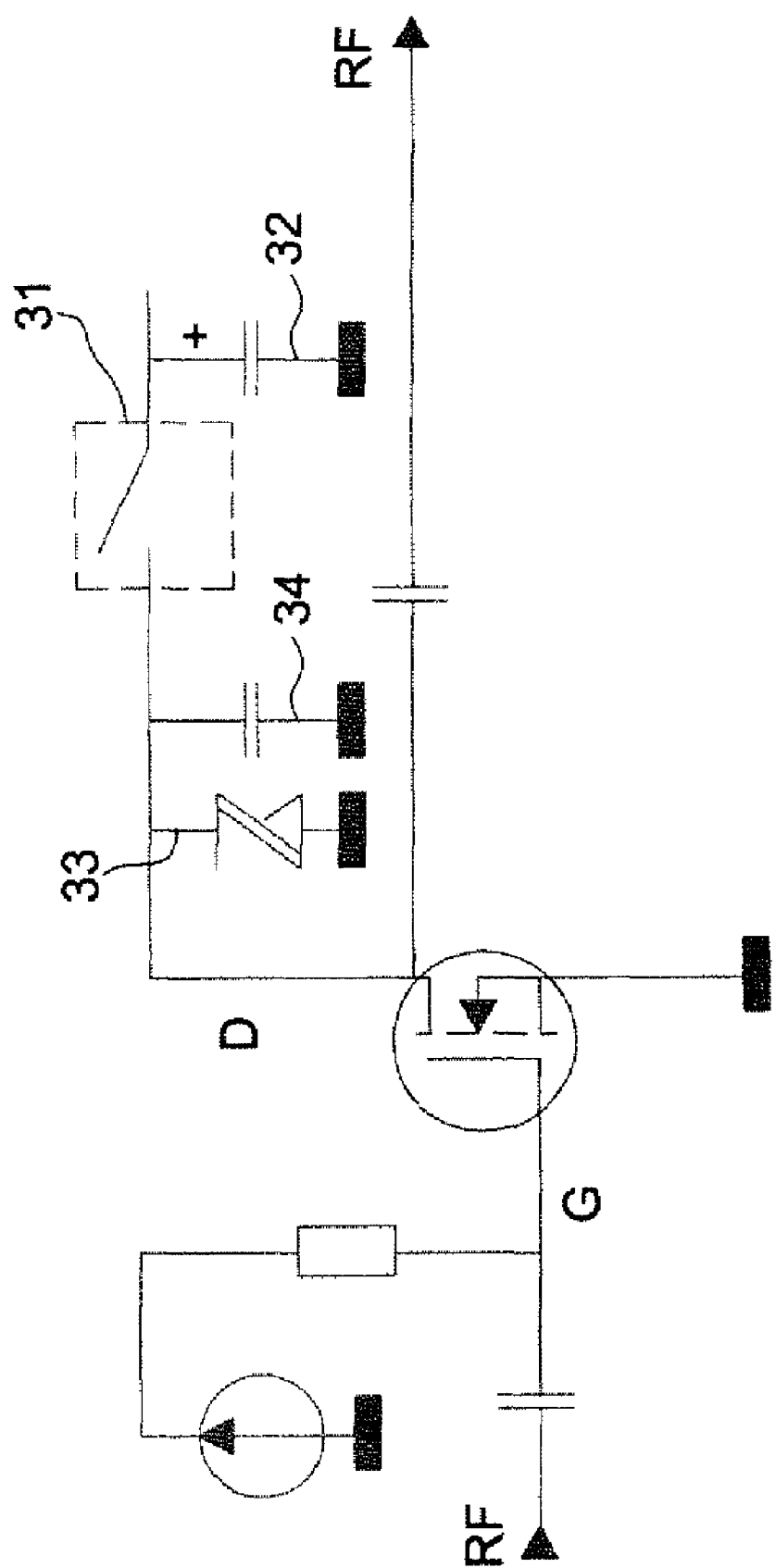

FIG. 3 represents an LDMOS transistor operating in pulse mode with power RF amplification.

The gate G of the transistor receives the frequency-modulated signal and is powered by a gate power supply. The drain D is linked to a DC power supply by means of a low loss switch 31. The switch 31 is controlled by means of the modulated signal's transmit synchronization signal sync. The drain current is present only when the drain is powered. A rapid bidirectional voltage peak clipping device 33, with a value between the peak power supply of the drain and the drain-source flashover voltage of the LDMOS transistor, offers effective protection against the overvoltages inherent to this type of operation. The capacitor 34 provides RF decoupling.

The necessary instantaneous energy is supplied by a reservoir capacitor 32 with a high value calculated according to the charge rate of transmitter and low series resistance. The capacitor is chosen to minimize the losses.

The low-loss switch is implemented, for example, using MOSPOWER transistors. It is therefore easy to implement and offers all the qualities of resistance to the high peak drain current and low losses.

The gate power supply VG can be:

a variable gain control DC voltage, for example a variable gain amplifier, a modulation signal for a stage used as a modulator.

The gate voltage can be amplitude-controlled, adjusting the idle drain current, adjusting the RF gain of the stage.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A device for controlling least two peak power levels for an amplifier operating in pulse mode, comprising
a premodulation stage comprising:
a first amplifier stage, comprising at least one amplifier and a processing device adapted to supply a square-wave signal to the amplifier,
a second amplifier stage, comprising at least one amplifier and a processing device adapted to supply a signal having a shape roughly identical to the shape of the applied modulation,
a power-locked stage comprising:
a coupler and detector for sampling a part of the signal at the output of the amplification subsystem and sending it to a video amplifier,
a peak detector and a level discriminator suitable for generating a modulation signal to an amplifier,
power supply means for the amplifiers.

2. The device as claimed in claim 1, wherein the first amplification stage comprises an LDMOS transistor used in class AB with a pulse drain power supply.

3. The device as claimed in claim 1, wherein the gain of the first amplifier stage is controlled by a variable DC voltage generated from digital tables addressed according to the frequency to be transmitted and the normal power/reduced power ratio.

4. The device as claimed in claim 1, wherein the second amplification stage comprises an LDMOS transistor used in class AB with pulse drain power supply.

5. The device as claimed in claim 1, wherein the gain of the stage is controlled by a variable-amplitude modulated voltage.

6. The device as claimed in claim 1, wherein comprising two digital tables addressed according to the frequency to be transmitted and the Pnormal/Preduced discrete.

* * * * *